United States Patent [19]
Grodstein et al.

[11] Patent Number: 6,046,984
[45] Date of Patent: Apr. 4, 2000

[54] PRUNING OF SHORT PATHS IN STATIC TIMING VERIFIER

[75] Inventors: Joel Joseph Grodstein, Mountain View, Calif.; Nicholas L. Rethman, Hudson; Nevine Nassif, Arlington, both of Mass.

[73] Assignee: Digital Equipment Corp., Maynard, Mass.

[21] Appl. No.: 08/827,868

[22] Filed: Apr. 11, 1997

[51] Int. Cl.[7] .......................... G01R 31/08; H04L 12/28; G06F 15/00

[52] U.S. Cl. ......................... 370/248; 370/248; 370/251; 370/252; 370/241; 370/254; 370/256; 364/488; 364/489; 364/490; 364/491; 395/500; 395/550; 395/555

[58] Field of Search .................................. 370/248, 251, 370/252, 241, 516, 254, 256, 400, 503; 364/488, 489, 578, 490, 491, 576, 500; 395/183, 555, 550, 500

[56] References Cited

U.S. PATENT DOCUMENTS

| | | | |
|---|---|---|---|
| 5,636,372 | 6/1997 | Hathaway et al. | 395/555 |
| 5,648,909 | 7/1997 | Biro et al. | 364/488 |
| 5,651,012 | 7/1997 | Jones, Jr. | 371/22.1 |
| 5,657,239 | 8/1997 | Grodstein et al. | 364/488 |

OTHER PUBLICATIONS

Ousterhout, J.K., "a switch–Level Timing Verifier for Digital MOS VLSI," *IEEE Transactions on Computer–Aided Design*, CAD–4(3) :336–349 (Jul. 1985).

Jouppi, N.P., "Timing Analysis and Performance Improvement of MOS VLSI Designs," *IEEE Transactions on Computer–Aided Design*, CAD6 (4) :650–665 (Jul. 1987).

McWilliams, T.M., "Verification of Timing Constraints on Large Digital Systems," *17th DA Conference*, pp. 139–147 (Jun. 1980).

*Primary Examiner*—Brian Zimmerman
*Assistant Examiner*—Man Phan
*Attorney, Agent, or Firm*—Hamilton, Brook, Smith & Reynolds, P.C.

[57] ABSTRACT

A conservative algorithm for pruning data paths during logic circuit timing verification is disclosed. It uses the correlation between delays on data paths and clock paths in order to prune non-critical data paths during the traversal of the network. Subnetworks are identified in the larger network. Pruning data consisting of the minimum possible delay across all possible paths through the subnetwork, the deskewing clocks, the clock arrival times, and hold times at the synchronizers in the subnetwork are identified the first time each subnetwork is analyzed. In later analysis, the pruning data stored for each subnetwork is used to determine whether a data path can be pruned. A path can be pruned if it is shown to be race-free based on the pruning data. In this way, non-critical paths need only be traced once during timing verification.

21 Claims, 6 Drawing Sheets

PRUNING OF SHORT PATHS IN STATIC TIMING VERIFIER

BACKGROUND OF THE INVENTION

The signals within integrated circuits can be many times divided into two classes: clock signals and data signals, each of which has different roles. Generally, phase timing is unconditional for clock signals, whereas data signals are unknown during the clock's phase. In the typical logic circuit design, the data signals propagate through combinational logic and are received at clock signal controlled logic elements such as latches or flip-flops. These clock-controlled circuit elements function to resynchronize the data signals along a scheme common to the circuit as a whole.

Accepting that data signals require some non-zero time to propagate through the combinational logic circuit, it would be desirable to have all of the clock-controlled circuit elements act in unison to resynchronize the flow of data signals. There is, however, delay in clock paths due to combinational logic and interconnect. Therefore, clock signals require time to propagate throughout the integrated circuit. These effects lead to clock skew, which undermines uniform synchronization.

One job of the circuit designer is to manage clock skew. Failure typically occurs where the data signal races the clock signal to some clock-controlled circuit element. If the data reaches the circuit element before the clock, the previous data signal held at the element is lost, and the present data signal is latched through the element on the wrong phase of the clock. This leads to the improper operation of the circuit.

Tools exist for assisting the designer in locating data races within an integrated circuit design. These tools operate on a description of the integrated circuit, typically termed a netlist, which includes such information as the delay through the various logic elements and on the paths between elements within the circuit design. Basically, the tools trace the paths of data signals through the circuit and compare the worst case, i.e., latest, arrival time of a clock signal into a circuit element with the worst case, i.e., earliest, arrival time for the data. The tool confirms whether or not the clock signal will always beat the data signal, typically by some design margin.

Previously, there have been two general schemes for implementing path tracing through an integrated circuit's logic network: breadth-first and depth-first. The former begins at the root node of the combinational tree and steps down each fan-out path from that node to the first-level nodes; this process is then repeated for the first-level nodes until the entire network is covered. The depth-first approach pushes a data signal on a path through the entire network to a leaf node L1, i.e., a node with no children. From L1, L1's parent node N1 is visited and each of N1's children are visited in turn. For each child, if the node has no children, the algorithm returns to Nl; otherwise it visits the children of that child, and so on. Pruning techniques have been used with breadth-first and depth-first analyses in order to reduce the time necessary to analyze a network by removing less critical paths from the analysis.

SUMMARY OF THE INVENTION

New logic designs are using various techniques to manage power dissipation as both device density and clock speeds increase. Since a large part of a chip's power may be dissipated in clock lines, power-management strategies focus on: 1) long-tic designs with fewer latches, and hence less clock loading; and 2) buffered and conditional clock trees to reduce clock power dissipation. These strategies must be fully utilized in newer, low-power designs.

Unfortunately, these two design trends detrimentally impact race analysis. As more combinational logic is added between latches, more combinational paths must be traced. Buffered and conditional clock trees increase clock skew. The problem is further exacerbated when reconvergent logic schemes are used. The number of combinational paths increases exponentially with each added logic layer.

The present invention is directed to a pruning process used when tracing combinational paths during logic circuit timing verification. It relies on analyzing the correlation between worst-case delays on data paths and on clock paths. Subnetworks are identified in the larger network of the circuit. The downstream terminating nodes of these subnetworks should be at either synchronization points or primary outputs of the network. The worst-case data propagation times among all possible data paths through the subnetworks are computed along with the subnetwork's deskewing clock, and the worst-case arrival time for the clock. In later analysis, this information is used to identify paths that will operate correctly, removing the need to retrace the paths. In this way, each combinational path in the subnetwork may be traced only once.

In one preferred embodiment, the pruning process is used in data race analysis. The worst-case arrival time information of the clocks is their latest arrival times, and the worst-case data propagation times are the minimum propagation times. In other implementations, the invention may be used in critical path analysis in which it is confirmed whether the data reaches the clock-controlled element or synchronizer before the clock, usually by a set-up time. Here, the maximum propagation time of the data is compared to the minimum delay of the clock.

In other specifics of the embodiments, every clock signal is first pushed through the networks in order to identify places where the clock signals synchronize the data, called synchronization points, and the arrival times at these points.

In the preferred scheme, a data path beginning at an input of the network and ending at either a synchronization point or an output of the network is chosen. If the data path ends at a synchronization point, the corresponding clock path is identified, i.e., the clock path which generates the clock signal at the synchronization point, and the node common to the data path and clock path, which is called the common clock node. Race conditions are checked at the synchronizer by comparing the minimum data delay to the maximum clock delay where the minimum data delay is the delay from the common clock node to the synchronizer along the data path and the maximum clock delay is the delay from the same upstream common clock point to the same synchronizer along the clock path.

The process uses a depth-first algorithm to traverse the circuit along the data path comparing propagation times along paths between a given node and all its downstream synchronizers, retaining only the time of the smallest data delay to all its downstream synchronizers along with the synchronizers' deskewing clocks. This information is stored in pruning records and used whenever that node is revisited in order to determine the likelihood of a race at one of the downstream synchronizers. If the possibility of a race exists, the downstream paths are traced in order to either report a race or prove the race to be impossible. If there is no possibility of a race, all downstream paths can be pruned and therefore do not need to be traced. In cases where a risk of race exists, delay is removed from the clock path or delay added to data paths.

In a preferred recursive implementation, worst-case data propagation times through a larger subnetwork are developed by combining previously-computed worst-case propagation times for smaller, encompassed subnetworks with worst-case propagation times between nodes in the larger, but not the smaller, subnetworks. In this way, previously calculated pruning information is used to prune larger areas.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
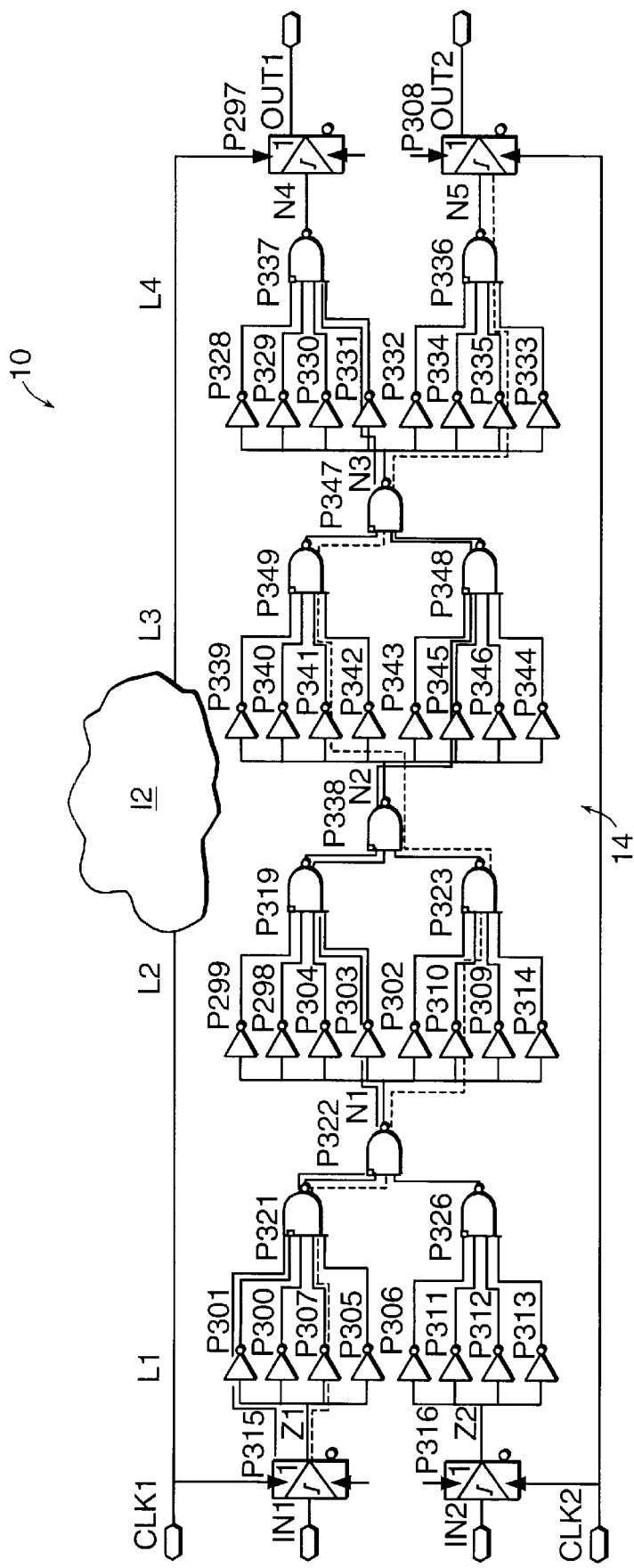
FIG. 1 is a circuit diagram illustrating path tracing through a network according to the prior art.

FIG. 1 is an exemplary network 10 from an integrated circuit. To verify its proper operation using prior art timing analysis techniques, the delay experienced on every combinational path, see dashed and solid lines, to the downstream clock-controlled circuit elements or synchronizers P297, P308, here shown as latches, must be compared to the time at which the corresponding clock signals CLK1, CLK2 are received by the latches.

By observation, a race between a data path beginning at CLK2 and ending at P308 seems unlikely since CLK2 appears subject to little skew. The answer to whether a race between a data path beginning at CLK1 and ending at p297, however, depends on the delay 12.

The problem is that conventionally all of paths through the network must be traced to ensure that the CLK1 and CLK2 always beat the data signals through the combinational logic 14. Note that races between paths beginning at CLK2 and ending at P297 and races between paths beginning at CLK1 and ending at P308 cannot be checked given the information in FIG. 1 as the clock generation network for CLK1 and CLK2 is absent. The number of paths, however, can be large, unacceptably slowing the analysis for complex circuits. In fact, the number of paths increases geometrically with each added logic level L1–L4, in the illustrated reconvergent scheme.

Figure 2:
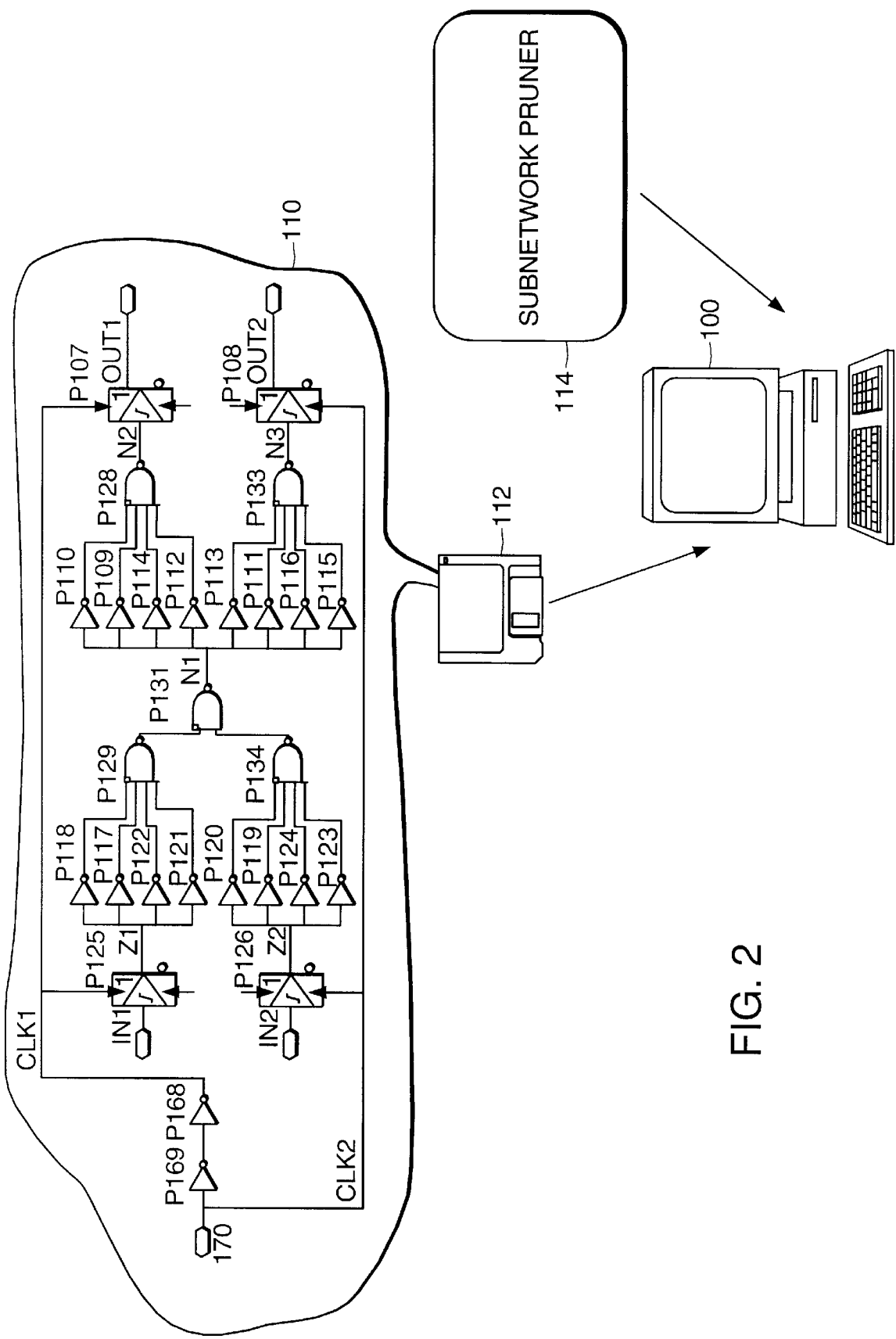
FIG. 2 is a schematic diagram illustrating a timing verification system according to the present invention.

FIG. 2 shows a timing verification system implementing pruning, which has been constructed according to the principles of the present invention. A workstation or other processing resource 100, executes a timing verification tool that traces combinational paths through the networks of integrated circuits in order to verify proper operation of the circuits. In one embodiment, the timing verification tool is Zrace, a product of the Digital Equipment Corporation.

Typically, the integrated circuit is characterized by a netlist 110 that describes the circuit elements in the integrated circuit, the interconnection of the circuit elements, the delays experienced by signals passing through the circuit elements, and the delays on paths between elements. In practice, the netlist 110 is loaded into the workstation 100 on a disk 112 or downloaded through a computer communications network.

According to the invention, the timing verification tool utilizes the inventive subnetwork pruner 114 that speeds the path tracing and timing analysis of the netlisted circuit 110. Once the analysis is complete, delay may be added to data paths or clock paths made faster to avoid race conditions.

Figure 3:
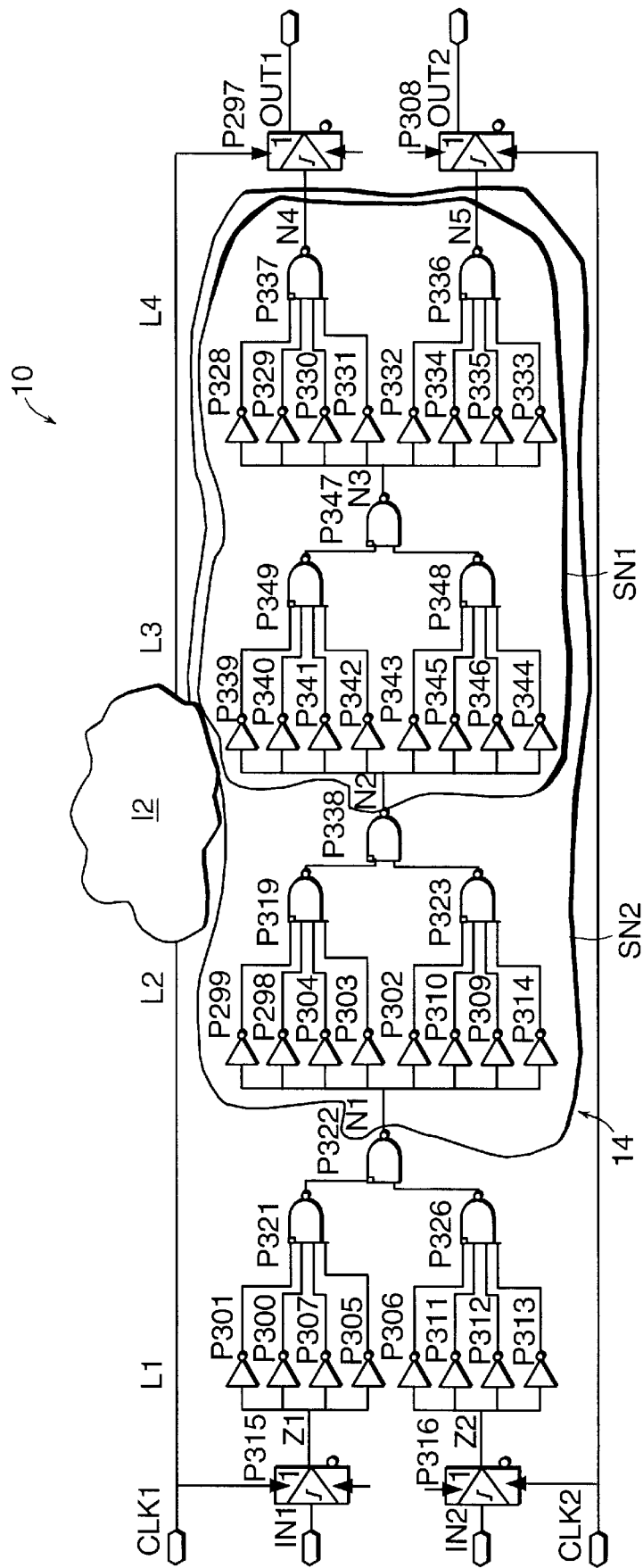
FIG. 3 is a circuit diagram illustrating a process for pruning subnetworks during a tracing process for the combinational paths according to the present invention.

FIG. 3 illustrates the subnetwork pruning process of the present invention. Subnetworks SN1, SN2 are identified within the network 10. The minimum possible or worst case data signal propagation times are calculated across the subnetworks. Also, the deskewing clocks and their maximum or worst-case arrival times at the synchronization points in the subnetworks are identified. These worst case propagation times for signals through the subnetwork along with the list of deskewing clocks are used when tracing paths through the surrounding network to identify possible race conditions.

According to the technique, beginning with subnetwork SN1, every path between nodes N2 and N4 and nodes N2 and N5 is traced. The minimum propagation time between nodes N2 and N4 and nodes N2 and N5 is calculated among every one of the possible paths between the nodes.

Once this minimum propagation time through subnetwork SN1 is calculated, the number of paths to determine the minimum propagation time through subnetwork SN2 is reduced geometrically. No non-critical paths between node N2 and node N4 or node N2 and node N5 must be traced again. The paths between nodes N2 and N4 or node N2 and node N5 are now replaced with the minimum delay from node N2 to node N4, the deskewing clock CLK1, and its arrival time and the minimum delay from node N2 to node N5, the deskewing clock CLK2, and its arrival time. Thus, to analyze subnetwork SN2, every path between nodes N1 and N2 is analyzed to determine the minimum data propagation time among these paths. This N1→N2 minimum data delay, i.e., the delay between nodes N1 and N2, is then added to the N2→N4 and N2→N5 minimum data delay, i.e., the delay between nodes N2 and N4 and the delay between nodes N2 and N5, to obtain the minimum data delay through subnetwork SN2 as a whole.

In this way, subnetworks may be identified in the network to be analyzed and then pruned, to be replaced by only a minimum data delay time, deskewing clocks, and their maximum arrival times. These data delay times, deskewing clocks, and maximum clock arrival times then can be progressively used to accelerate the analysis of larger subnetworks including the analyzed subnetwork. The pruning speeds the timing verification process by ensuring that non-critical parallel paths between the same nodes need only be traced once. Thus, in the illustrated reconvergent scheme, substantial time reduction is achieved in the tracing process.

Figure 4A:
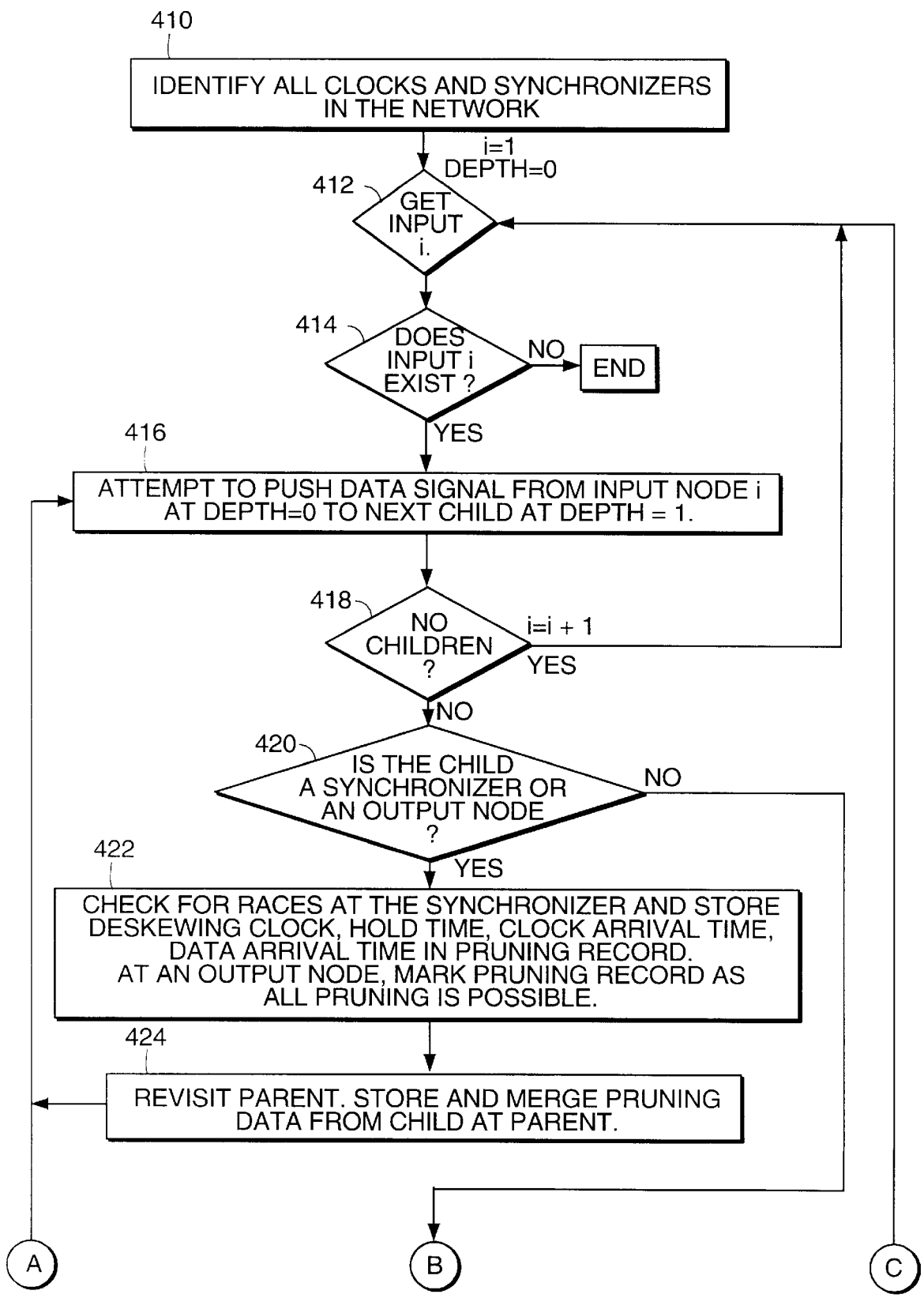
FIGS. 4A, 4B, and 4C show a process diagram illustrating the tracing and pruning process of the present invention.
Figure 4B:
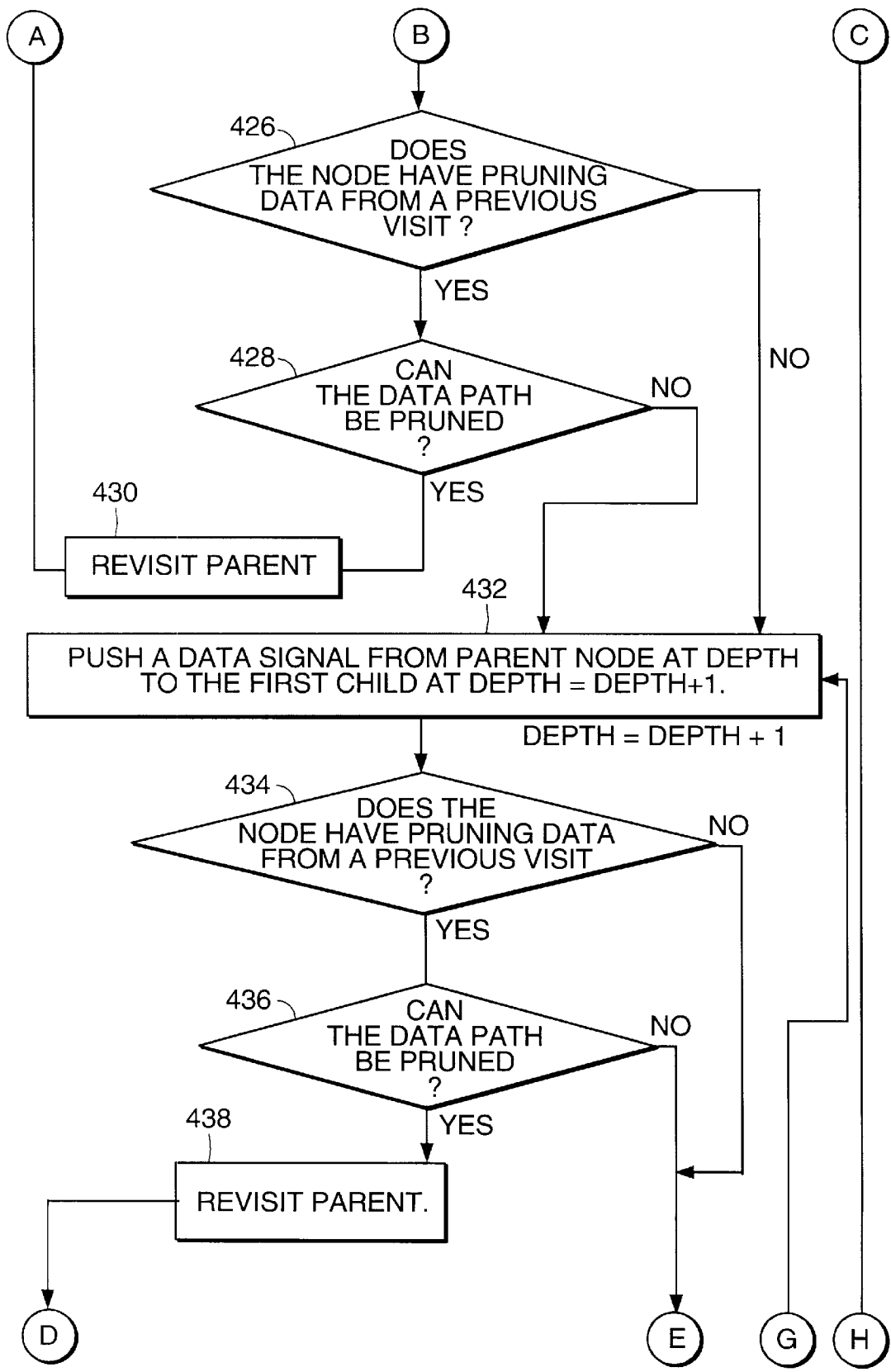
Figure 4C:
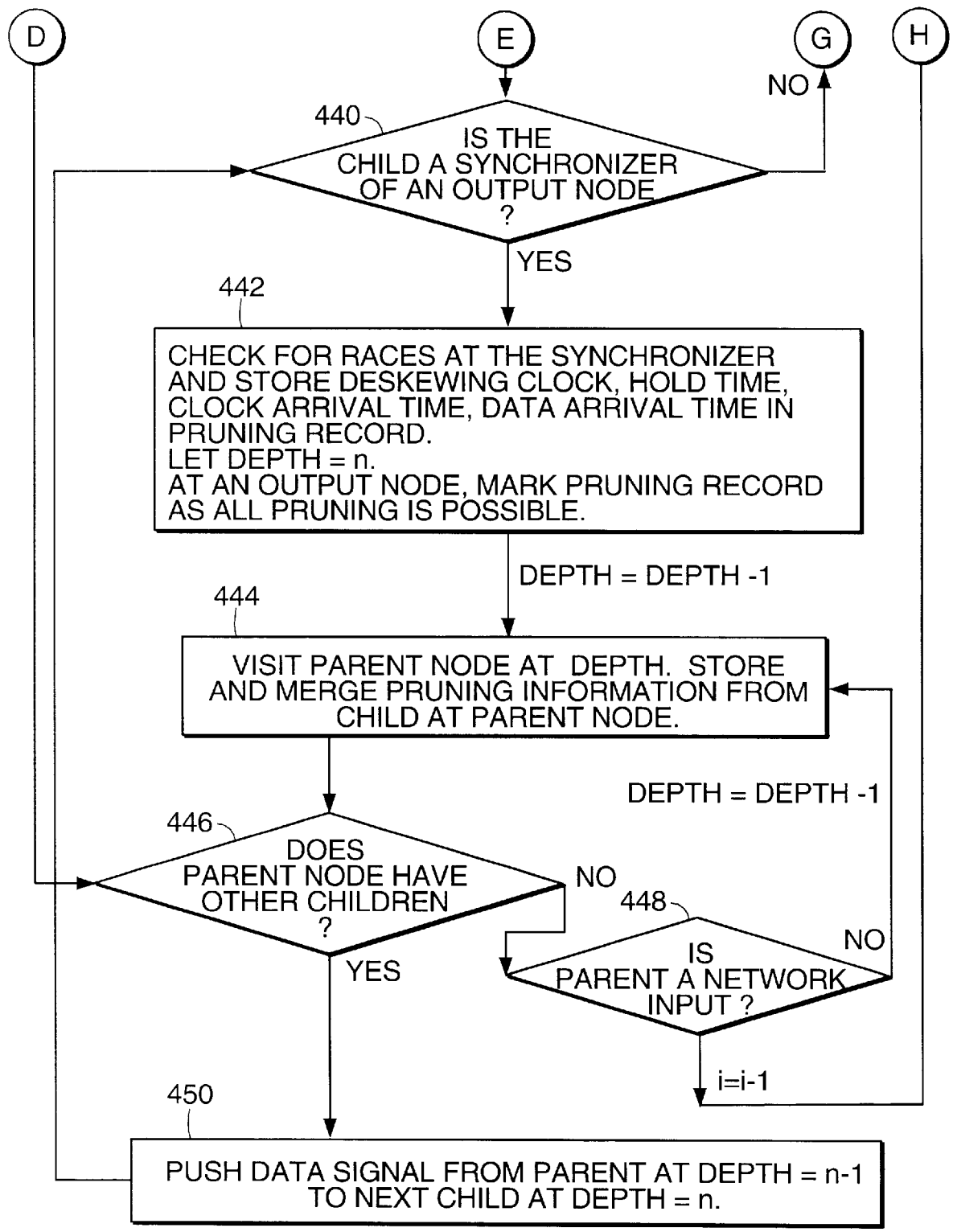

FIGS. 4A–4C show a process diagram illustrating the inventive pruning process using a depth-first scheme.

Although, alternatively, it may be easily implemented in a breadth-first scheme.

The clocks and synchronizers are first identified, and clock signals are pushed through the logic network of the integrated circuit in step 410. For each synchronizer or clock-controlled circuit element, e.g., latch or flip-flop, where the clock is used to synchronize data, the arrival time of the controlling clock is recorded.

In the next steps 412 and 414, an input (i) to the network is chosen unless none remain, and in step 416 one of its children is visited. If no child exists in step 418, the process returns to step 412 to select the next input(i).

If the visited child is a synchronizer or an output node of the network in step 420, the data path is compared to the clock path to check for races in step 422. Pruning information is stored at the child and passed back to the parent in step 424 where it is merged, retaining the worst-case propagation times. The process then returns to step 416 and the next child of the parent is visited. If that node has no more children (step 418) the next input is visited when the algorithm returns to step 412.

If in step 420, the child is not a synchronizer, the node is checked to see if it contains pruning data from a previous run (step 426). If it does and the path can be pruned (step 428), the process revisits the parent in step 430 and returns to step 416 to push the data signal to the next child. If either no pruning data exists or it cannot be used, the algorithm uses depth-first traversal to push the data signal through the network till it finds a synchronizer in steps 432, 434, 436, and 440. For example, in FIG. 3 a data signal starting at input CLK1, would be pushed through the network till it reaches either latch P297 or P308 or output node OUT1 or OUT2. Step 438 covers the situation where a path from the parent may be pruned, but other paths out of the parent may exist.

At the synchronizer at step 442, the data path is compared to the clock path for races and pruning data containing the minimum data arrival time, the maximum clock arrival time, the deskewing clock, and the hold time is passed back to the parent node and merged in step 444. Once the pruning data from the synchronizer is stored at the parent node, the next child, if one exists (step 446) of the parent is visited in step 450 and the algorithm returns to step 440 in search of another synchronizer or netowrk output (steps 432–440). If the parent node has no more children, its parent is visited (steps 448→444) if it has a parent, or the next input to the network is chosen (step 448→412) if the parent is an input.

In FIG. 3, pruning data collected for example at nodes N4 and N5 would be returned to node N3, through the 8 possible paths through elements P328–P333. The minimum data delay over all paths from N3 to N4 and N3 to N5 would be stored at N3 along with the deskewing clocks, clock arrival times, and hold times of latches P297 and P308. The pruning data would then be passed back to node N2. From node N2, the process would then choose another child of N2 and push down another data path in steps 446 and 450. Assume that the first time the data path went through P339, the second time it could go through P340. When the data path reaches N3 again, it can use the pruning data stored there during the first visit through N3 to determine whether the path can be pruned or not. If it can, then it will not be necessary to push the data path all the way to P297 and P308 on the second and subsequent visits of node N3 which saves much computation time. When all paths from N2 to N3 are visited, the pruning data is merged and stored at N2 and passed back to N1.

The traversal proceeds in this manner using pruning data when available and applicable to prune the data path.

In alternative embodiments, this depth-first approach could be converted to a breadth-first approach.

The following is a metacode description of a recursive process for inventive pruning process.

```
foreach primary input node NPI
   visit_recursively (NPI);
visit_recursively (node N)
{
(1) if ((N already has a pruning record
       N->prune) && (it is sufficient to
       prune the current path on the
       stack))
    return;
   push N onto a stack;
(2) total_prune=everything_is_OK;
   foreach fanout latch FOL of N
   {
(3)    Clk=FOL's controlling clock;
       check for races involving the
          current path on the stack
          against Clk;
       pin_prune.clock=Clk;
       pin_prune.ck_delay=setup time
          of latch FOL;
       pin_prune.data_delay=0;
       total_prune=merge
          (total_prune,pin_prune);
   }
   foreach fanout gate FOG of N,
   {
       FON=FOG's output node;
(4)    visit_recursively (FON);
       pin_prune=FON->prune;
       pin_prune.data.delay+=delay of
          gate FOG);
       total_prune=merge
          (total_prune,pin_prune);
   }
   N->prune=total_prune;
   pop N from the stack;
}
merge (prune1,prune2)
{
(5) if (prune1==everything_is_OK)
       return (prune2);
   if (prune2==everything_is_OK)
       return (prune1);
(6) if (prune1.clock==prune2.clock)
       return (prune1.clock and
          MAX (ck_delays) &
          MIN (data_delays))
(7) if (we can find a common ancester to
       prune1.clock and prune2.clock)
       return (the common ancester and
          the total maximum clock-
          path delay &
          MIN (data_delays));
(8) return (a special record that says no
       pruning is possible);
}
```

This process creates a prune structure node→prune→clock, node→prune→ck_delay, and node→prune →data_delay for each node, which essentially describes the ability of the downstream network to prevent races. When a node is first visited, the node's downstream network is traversed and analyzed to store and create the node's prune structure. On later visits, this pruning record is used as history data to perform pruning. This prune structure identifies that the worst-case path through the downstream network takes a minimum of 'data_delay' time units and races against a version of 'clock' which has been delayed by 'ck_delay' time units.

The code at (1) uses this information to see if the current path can be pruned. It reads the current path and its shortest delay from the stack, adds the delay in prune→data_delay, and sees if this is enough delay to be race-free against prune→clock. If so—i.e., if the worst-case extension of the current path through the downstream network is guaranteed race-free—then all path tracing at the current node can be pruned.

If no pruning is possible, then the traversal of the network continues. The recursive algorithm visits the downstream network and keeps track of the worst path through it. This is done at each fanout pin, one by one. If a fanout pin is a latch, then the code at (3) first checks whether the current path to the latch is fast-enough to constitute a race (and, if so, reports it). In any case, the latch itself is considered as a small subnetwork. The worst-case (indeed, the only) path through it races against the latch's clock after the latch's set time. The merge ( ) function keeps a running worst case of the encapsulated subnetworks at each fanout pin in turn.

If, instead of a latch, the fanout pin is a combinational gate, then the recursive traverse continues at (4). It is assumed that, in traversing the downstream network, its worst case behavior is encapsulated in the pruning record at node 'FON'. Consider a small subnetwork consisting of the network downstream of 'FON', augmented by the gate 'FOG', inasmuch as there is only one path through FOG from 'N' to 'FON', the worst-case path from 'N' through the subnetwork is guaranteed to simply have its delay increased by the delay of 'FOG'. This is calculated, and the running worst case is updated using the merge ( ) function as before.

The code at (2) initializes the running worst case, by starting with the most optimistic pruning history possible.

Merge ( ) is given two pruning records. Each one encapsulates a subnetwork fanning out from the current node. Merge ( ) tries to look at two pruning records and come up with a single one which encapsulates the worst behavior of the composite subnetwork. If one of the two records is the special value everything_is_OK, then the code at (5) returns the other record. This essentially handles the initial value of the running worst case, since anything is worse than 'everything_is_OK'.

If the two pruning records have the same clock node, then all paths through the composite subnetwork race against this clock as well, and the delay is simply the worst of the two delays. The code at (6) handles this case.

If they two pruning records have different clock nodes, then the code at (7) searches for a common ancestor as the single antecedent which all paths race against. Of course, since this clock path and delay are longer, the changes of successful pruning are slimmer.

Finally, in any other case, the composite subnetwork can not be represented with a simple pruning record, and the pruning algorithm essentially fails (8).

While this invention has been particularly shown and described with references to preferred embodiments thereof, it will be understood by those skilled in the art that various changes in form and detail may be made therein without departing from the spirit and scope of the invention as defined by the appended claims.

What is claimed is:

1. A method for tracing combinational paths through a network of an integrated circuit to verify proper operation, the method comprising:

for nodes on a data path which fanout to downstream clock-controlled circuit elements, identifying subnetworks driven by these driving nodes;

determining worst-case data propagation times through the subnetworks and worst-case arrival time information of deskewing clocks at the downstream clock-controlled elements;

replacing these subnetworks with pruning records for each of the driving nodes of the subnetworks where each pruning record contains the worst-case data propagation times through the subnetworks, deskewing clocks at the downstream clock-controlled elements, the worst-case arrival time information of the deskewing clocks at the downstream clock-controlled elements, and timing characteristics of the downstream clock-controlled elements;

determining worst-case data path delays between upstream nodes and the driving nodes; and using the pruning records at the driving nodes to identify paths that will operate correctly.

2. The method described in claim 1, wherein the worst-case arrival time information of the clocks are latest arrival times and the worst-case data propagation times are the minimum propagation times to enable race analysis.

3. The method described in claim 1, wherein the step of determining the worst-case arrival time information of deskewing clocks at the downstream clock-controlled elements comprises:

pushing clock signals through the network; and storing the clock arrival times associated with the clock-controlled circuit elements within the network.

4. The method described in claim 1, wherein the step of determining the worst-case data propagation times of subnetworks comprises:

traversing every path through the subnetworks; and identifying the worst-case data propagation times from among the various paths.

5. The method described in claim 1, wherein the step of determining the worst-case data propagation times of subnetworks comprises:

determining worst-case data propagation times for all paths through a subnetwork; and determining worst-case data propagation times through a larger subnetwork by combining the worst-case propagation times for the subnetwork with other worst-case propagation times between nodes in the larger subnetwork.

6. A method for tracing combinational paths through a network of an integrated circuit to verify proper operation, the method comprising:

repeatedly determining a worst-case-data propagation time between two nodes and combining the worst-case data propagation time with a worst-case data delay through a subnetwork to a downstream clock-controlled circuit element to obtain a worst-case data delay for a larger subnetwork; and identifying combinational paths that operate properly by comparing the worst-case data delays to worst-case clock delays.

7. The method described in claim 6, wherein the worst-case clock delays are longest delays and the worst-case data propagation time is the minimum propagation time to enable race analysis.

8. The method described in claim 6, wherein the step of determining the worst-case clock delays comprises:

pushing clock signals through the network;

storing the clock arrival times associated with the clock-controlled circuit elements within the network;

determining a common clock node; and subtracting the arrival time of the clock at the clock-controlled circuit elements from the arrival time of the clock at the common clock node to obtain the worst-case clock delays.

9. The method described in claim 8, wherein the step of determining the common clock node comprises finding the node nearest to the clock-controlled synchronizer which is common to both a clock path and a data path.

10. The method described in claim 6, wherein the step of determining the worst-case data propagation time between the two nodes comprises:

traversing every path between the two nodes; and merging the propagation times for the paths to determine the worst-case propagation time.

11. A method for accelerating the tracing of combinational paths through a network of an integrated circuit to verify proper operation, the method comprising:

during the tracing of the paths, collecting pruning records containing worst-case data delay information, an arrival time information of a clock signal received at a downstream synchronizer, and timing characteristics of the synchronizer to characterize a downstream subnetwork of the network; and using the pruning records to remove the necessity of tracing all combinational paths through the network.

12. The method described in claim 11, wherein the arrival time information indicates longest delays of the clock signal and the worst-case data delay information indicates minimum data propagation time to enable race analysis.

13. The method described in claim 11, wherein the pruning records describe an ability of the downstream subnetwork to prevent races.

14. The method described in claim 11, wherein the step of collecting pruning records comprises identifying a worst-case path through the downstream subnetwork including the worst-case data delay.

15. The method described in claim 14, wherein identifying the worst-case path comprises recursively visiting the downstream subnetwork from each fan-out pin.

16. The method described in claim 11, wherein the step of collecting pruning records comprises using previously-created pruning records to characterize larger subnetworks in the network by combining worst-case data delays to upstream nodes defining the larger subnetworks with data delays of the previously-created pruning records.

17. A timing verifier for combinational paths through a network of an integrated circuit, the verifier comprising:

a netlist describing the integrated circuit network;

a processing resource that traces the network using the netlist to determine whether minimum data delays on combinational paths to synchronizers are longer than maximum clock delays to the synchronizers to verify proper operation, in which the processing resource prunes subnetworks from the network to decrease the time necessary to verify the proper operation of the integrated circuit, the pruning comprising:

calculating data delays among paths through each of the subnetworks; and replacing the subnetworks in the tracing process with the worst-case of the data delays, delay information for clock signals received at downstream synchronizers, and timing characteristics of the synchronizers to avoid future retracing through the subnetworks.

18. The timing verifier described in claim 17, wherein the processing resource calculates a clock arrival time at the synchronizers by pushing clock signals through the network and storing the arrival times associated with the synchronizers within the network.

19. The timing verifier described in claim 17, wherein the calculating of the data delays through the subnetworks comprises:

traversing everypath through the subnetworks;

determining the worst-case of the data delays through the subnetworks along the paths.

20. The timing verifier described in claim 17, wherein calculating the worst-case of the data delays through the subnetworks comprises, repeatedly, determining a worst-case data propagation time between two nodes and combining the worst-case data propagation time with a worst-case data delay to a downstream synchronizer to obtain a worst-case data delay for a larger subnetwork.

21. The timing verifier described in claim 17, wherein combinational paths that present a risk of race conditions are identified by comparing the worst-case, minimum, data delays to a latest arrival time of the clocks.

* * * * *